(12) United States Patent
Xiao (10) Patent No.: US 11,737,222 B2
(45) Date of Patent: Aug. 22, 2023

(54) CASE AND ELECTRONIC DEVICE (71) Applicants: K-TRONICS (SUZHOU) TECHNOLOGY CO., LTD., Jiangsu (CN); BOE Technology Group Co., Ltd., Beijing (CN)

(72) Inventor: Jun Xiao, Beijing (CN)

(73) Assignees: K-TRONICS (SUZHOU) TECHNOLOGY CO., LTD., Jiangsu (CN); BOE Technology Group Co., Ltd., Beijing (CN)

( * ) Notice: Subject to any disclaimer, the term of this patent is extended or adjusted under 35 U.S.C. 154(b) by 666 days.

(21) Appl. No.: 16/958,608

(22) PCT Filed: Aug. 23, 2019

(86) PCT No.: PCT/CN2019/102320
§ 371 (c)(1),
(2) Date: Jun. 26, 2020

(87) PCT Pub. No.: WO2021/035422
PCT Pub. Date: Mar. 4, 2021

(65) Prior Publication Data
US 2023/0087511 A1    Mar. 23, 2023

(51) Int. Cl.
*H05K 5/00* (2006.01)
*H05K 5/02* (2006.01)
*H05K 7/20* (2006.01)

(52) U.S. Cl.
CPC ....... *H05K 5/0214* (2022.08); *H05K 7/20145* (2013.01); *H05K 7/20154* (2013.01); *H05K 7/20972* (2013.01)

(58) Field of Classification Search
CPC . G06F 1/20; G06F 1/181; G06F 1/183; G06F 1/206; G06F 1/188; H05K 7/20745;
(Continued)

(56) References Cited

U.S. PATENT DOCUMENTS

| 4,557,095 A | * | 12/1985 | Rice | E06B 9/01 |
| | | | | 52/473 |
| 5,201,879 A | * | 4/1993 | Steele | F24F 13/08 |
| | | | | 454/283 |

(Continued)

FOREIGN PATENT DOCUMENTS

| CN | 204153882 U | 2/2015 |
| CN | 107826032 A | 3/2018 |

(Continued)

OTHER PUBLICATIONS

European Search Report for 19933226.3 dated Aug. 1, 2022.
Office Action dated Jun. 18, 2020 for corresponding Chinese Application No. 201990000111.9.

*Primary Examiner* — Mandeep S Buttar
(74) *Attorney, Agent, or Firm* — ArentFox Schiff LLP; Michael Fainberg (57) ABSTRACT

The disclosure relates to the technical field of an electronic device, and provides a case and an electronic device. The case includes: a case body, which has a plurality of case sides, a cavity enclosed by the case sides and configured to accommodate the electronic device; a plurality of vents, which are disposed on at least part of the case sides and configured to ventilate between the case cavity and an external space; and a water retaining mechanism, which is on the inner wall of the case body and positioned at the vents.

18 Claims, 8 Drawing Sheets

(58) Field of Classification Search
CPC .......... H05K 7/20754; H05K 7/20836; H05K 9/0041; G02F 1/133308; G02F 1/133385; G02F 2001/133311; G09F 19/22; G09F 27/005
USPC ..... 361/695, 679.48, 679.46, 690, 678, 694, 361/692; 454/184, 188, 254
See application file for complete search history.

(56) References Cited

U.S. PATENT DOCUMENTS

| | | | |
|---|---|---|---|
| 10,219,417 B2 * | 2/2019 | Juan .................. | H05K 7/20972 |
| 10,299,415 B1 | 5/2019 | Yang et al. | |
| 2008/0222932 A1 * | 9/2008 | Yun .................... | H05K 7/20972 40/541 |
| 2010/0015904 A1 * | 1/2010 | Yeh .................... | B01D 46/0005 55/511 |
| 2011/0075363 A1 * | 3/2011 | Nakamichi ............... | G09F 9/35 361/696 |
| 2012/0099276 A1 * | 4/2012 | Lin ...................... | H05K 5/0213 361/692 |
| 2012/0298330 A1 * | 11/2012 | Mysse, III ............. | H05K 7/206 165/96 |
| 2013/0171921 A1 | 7/2013 | Nakamichi | |
| 2014/0313666 A1 * | 10/2014 | Chin .................. | H05K 7/20972 361/695 |

FOREIGN PATENT DOCUMENTS

| | | |
|---|---|---|
| CN | 107856604 A | 3/2018 |
| CN | 108665819 A | 10/2018 |
| CN | 208891110 U | 5/2019 |
| EP | 2169654 A1 | 3/2010 |

* cited by examiner

CASE AND ELECTRONIC DEVICE

CROSS-REFERENCE TO RELATED APPLICATIONS

This application is a National Stage of International Application No. PCT/CN2019/102320, filed Aug. 23, 2019, which is hereby incorporated by reference in its entirety.

FIELD

The present disclosure relates to the field of an electronic device, and particularly, to a case and an electronic device.

BACKGROUND

Currently, most of outdoor electronic devices (such as an outdoor advertising machine) implement waterproofness by making a closed complete machine, so that heat can only be dissipated by the surface of the complete machine and cannot be dissipated by air cooling, resulting in low heat dissipation efficiency. When the outdoor electronic devices work under a high-temperature condition for a long time, it is liable to cause damage to parts due to a high temperature so as to influence the service life of a display.

SUMMARY

In order to fulfill the object above, the present disclosure provides the following technical solution:
a case includes:
a case body comprising a plurality of case sides, and a cavity enclosed by the case sides and configured to accommodate an electronic device;
a plurality of vents disposed on at least part of the case sides and configured to ventilate between the case cavity and an external space; and
a water retaining mechanism disposed on the inner wall of the case body and positioned at the vents.

Optionally, the case body is a cuboid and includes a front side, a rear side, an top side, a bottom side, a left side and a right side;
the front side includes a front frame and transparent glass arranged on the front frame; and
the vents are disposed on the front frame of the front side, and the water retaining mechanism is connected with the front frame.

Optionally, the vents include a first group of vents and a second group of vents;
the front frame includes an upper border and a lower border; the first group of vents are disposed on the upper border, and the second group of vents are disposed on the lower border; and
the water retaining mechanism includes:
a first baffle arranged at the first group of vents on the upper border and connected with the upper border to form a first water storage portion surrounding the first group of vents; and
a second baffle fixed to the bottom side and arranged opposite to the second group of vents on the lower border.

Optionally, the front frame further includes a left border and a right border;
the case further includes a left flow guide plate and a right flow guide plate, wherein the edges of the left side flow guide plate are respectively connected with the left border, the left side, the top side and the bottom side so as to form a left flow guide interlayer; the edges of the right flow guide plate are respectively connected with the right border, the right side, the top side and the bottom side so as to form a right flow guide interlayer; and an extension direction of the first baffle is same as an extension direction of the upper border, and edges of both ends of the first baffle in the extension direction of the first baffle are respectively connected with the left flow guide plate and the right flow guide plate, so that both ends of the first water storage portion respectively communicate with the left flow guide interlayer and the right flow guide interlayer.

Optionally, water outlets are respectively formed at one end of the bottom side close to the left side, and at one end of the bottom side close to the right side; the water outlet at one end close to the left side is at the left flow guide interlayer and configured to discharge water in the left flow guide interlayer; and the water outlet at one end close to the right side is at the right flow guide interlayer and configured to discharge water in the right flow guide interlayer.

Optionally, the first baffle includes a first portion and a second portion;
a main side of the first portion is arranged opposite to the upper border of the front frame and extends from the left side to the right side;
the second portion extends from the left side to the right side;
the upper edge of the first portion is close to the top side and is connected with the top side, while the lower edge of the first portion is connected with the upper edge of the second portion; the second portion of the first portion is inclined towards one side of the upper border relative to the first portion, and the lower edge of the second portion is in sealed connection with the upper border; and
the first portion includes an opening configured to circulate air.

Optionally, the first portion includes one group of openings, and the one group of openings are disposed opposite to the first group of vents; and
the case includes one group of first fans corresponding to the one group of openings, and each of the first fans is arranged at a corresponding opening on one side of the opening away from the upper border of the front frame, and configured to blow air to one side of the upper border through the corresponding opening.

Optionally, the case further includes two groups of connectors respectively in detachable connection with the left flow guide plate and the right flow guide plate, and the two groups of connectors are configured to be in detachable connection with two side end faces of a display module accommodated in the case body so as to respectively fix two side end faces of the display module to the left flow guide plate and the right flow guide plate.

Optionally, the case includes one group of second fans inside, and the one group of second fans are fixed to the lower border of the front frame, and is above the second group of vents and configured to blow air towards the direction of the top side along the front side.

Optionally, the case further includes a heat dissipation plate, one group of third fans and one group of fourth fans inside, the heat dissipation plate is arranged opposite to the transparent glass, the edges of both sides of the heat dissipation plate are respectively connected with the two groups of connectors, and a space for accommodating the display module is formed between the heat dissipation plate and the transparent glass;

the third fans and the fourth fans are arranged on the surface of one side of the heat dissipation plate away from the transparent glass, and configured to blow air towards the direction of the top side; and the third fans are arranged close to the lower end of the heat dissipation plate, and the fourth fans are above the third fans.

Optionally, the case body includes rain shelters, positions of the rain shelters correspond to positions of the vents, and the rain shelters protrude towards a direction away from an outer side of the case body.

An electronic device includes a display module and the case according to any one of the above, and the display module is in the case and is in detachable connection with the case.

Optionally, the case includes the second baffle, and the second baffle is right below the display module.

Optionally, the electronic device further includes a circuit board which is in the case body and configured to be electrically connected with the display module, and the circuit board is arranged on the second baffle and on one side of the second baffle away from the lower border of the front frame.

DETAILED DESCRIPTION OF THE EMBODIMENTS

The technical solution of the embodiments of the present disclosure will be described in a clearly and fully understandable way in connection with the drawings related to the embodiments of the present disclosure. It is obvious that the described embodiments are just a part but not all of the embodiments of the present disclosure. Based on the embodiments of the present disclosure, those skilled in the art can obtain other embodiments, without any inventive work, which should be within the scope of protection of the present disclosure.

Figure 1:
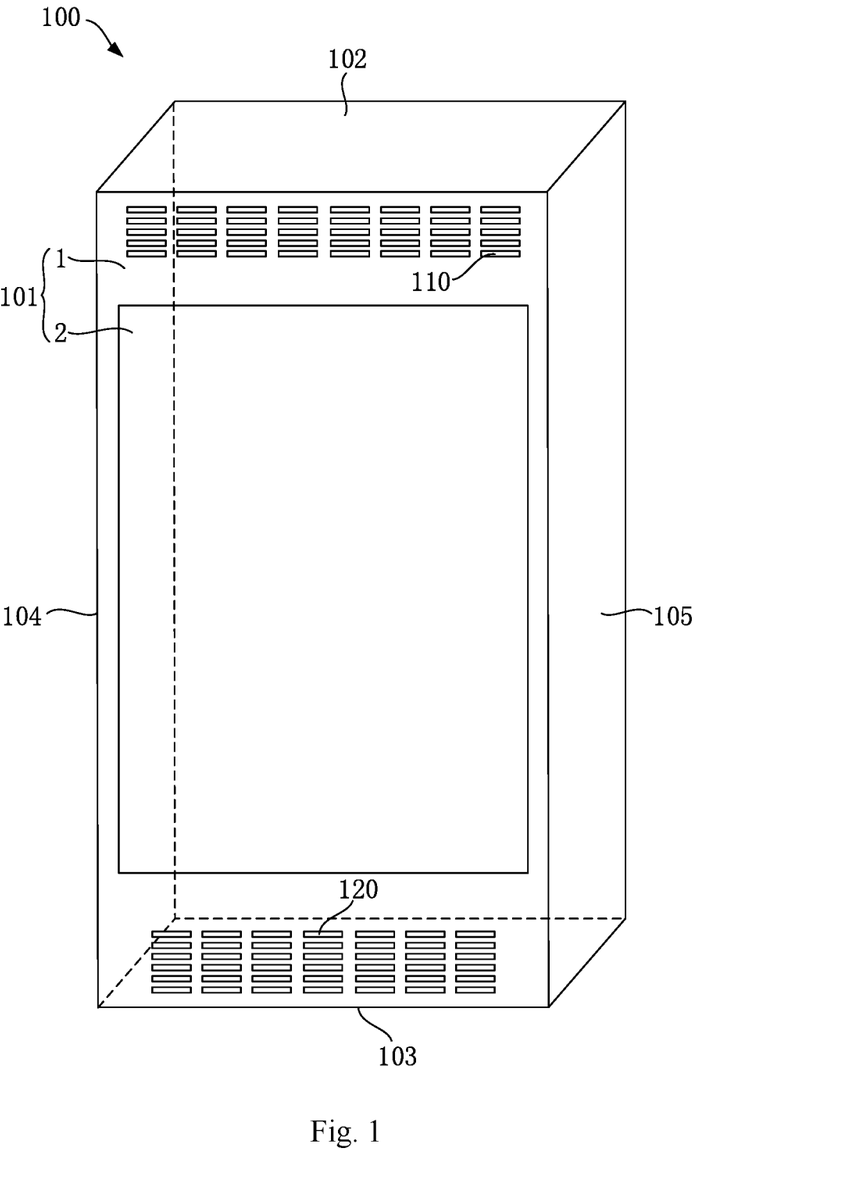
FIG. 1 is a schematic diagram of a structure of a case body of a case provided by an embodiment of the present disclosure.
Figure 3:
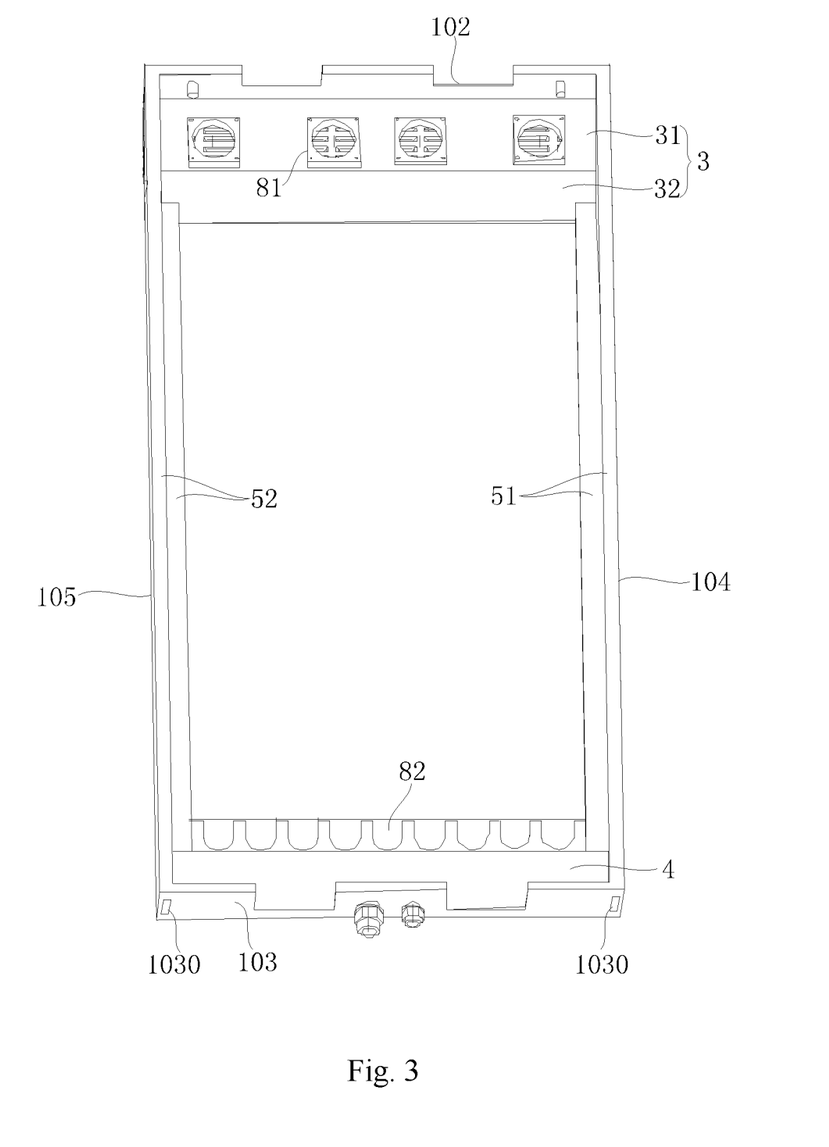
FIG. 3 is a schematic diagram of a partial structure of the inside of a case body of a case provided by an embodiment of the present disclosure.
Figure 4:
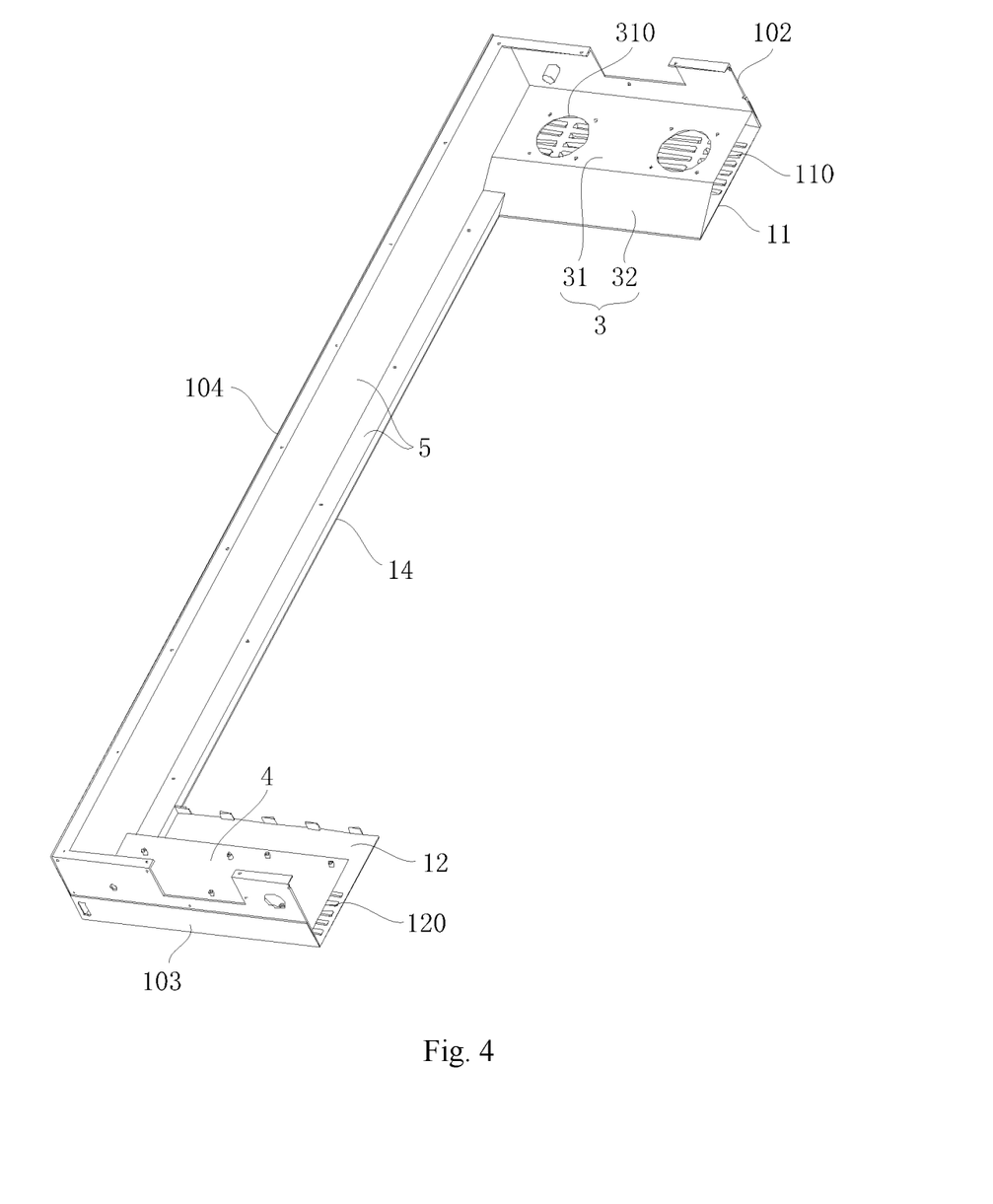
FIG. 4 is a schematic diagram of a partial section structure of the inside of a case body of a case provided by an embodiment of the present disclosure.
Figure 5:
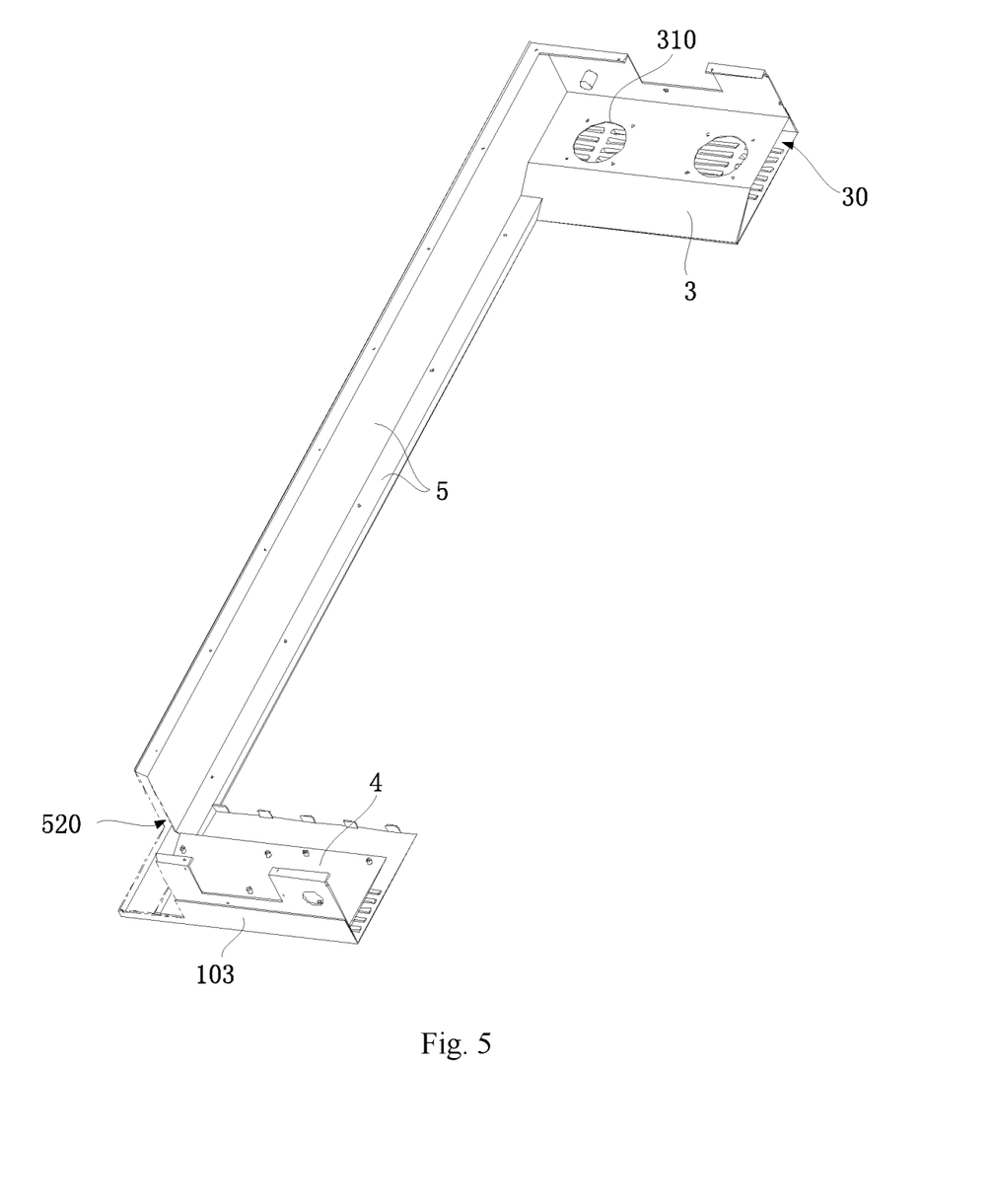
FIG. 5 is a schematic diagram of a partial section structure of the inside of a case body of a case provided by another embodiment of the present disclosure.

As shown in FIG. 1, an embodiment of the present disclosure provides a case, including:

a case body 100 having a plurality of case sides, and a cavity for accommodating an electronic product (e.g., a display product) being formed by the plurality of case sides in an enclosed manner;

a plurality of vents, which are disposed on at least part of the case sides and configured to ventilate between the case cavity and an external space, e.g., a first group of vents 110 and a second group of vents 120 in FIG. 1; and a water retaining mechanism, which is positioned on the inner wall of the case body 100 and positioned at the vents, e.g., a first baffle 3 and a second baffle 4 in FIG. 3 to FIG. 5.

In some embodiments, the vents are disposed on the case body 100, so that heat dissipation may be carried out on modules inside the case by air cooling, and heat dissipation efficiency is relatively high. Meanwhile, the water retaining mechanism is arranged on the inner wall of the case body 100 and at the vents, so that rainwater through the vents may be blocked, then the rainwater is remained in the water retaining mechanism and it is avoided that the rainwater enters an electronic device accommodation space behind the water retaining mechanism, and thus, a waterproof effect of the case body 100 can be effectively improved. From the above, the case gives consideration to both heat dissipation and the waterproof design, and simultaneously has good heat dissipating and waterproof effects. The case in the application may be configured to accommodate an electronic device, is particularly applicable to an outdoor space, and exemplarily, may be used as an outdoor advertising case.

Exemplarily, as shown in FIG. 1, the case body 100 is a solid, and may be a cuboid, or a cube and the like. The case body has six sides both inside and outside, including two opposite sides, i.e., a front side 101 and a rear side, and four sides connected with the two sides, including a top side 102, a bottom side 103, a left side 104 and a right side 105.

In some embodiments of the application, descriptions, such as "top side", "bottom side" and "upper edge", "lower edge", "above", "below" and the like mentioned below, refer to descriptions on relative position and functional forms of a certain structure in a state that the case body is vertically placed (for example, in a placement state of the case, configured to display outdoor advertising).

Figure 7:
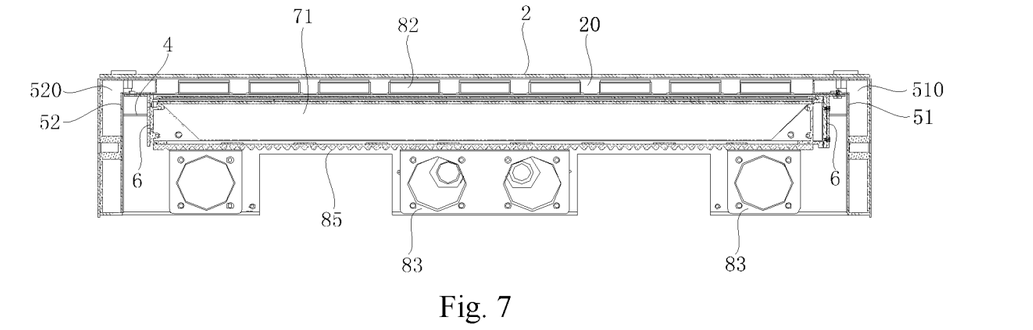
FIG. 7 is a schematic diagram of a sectional structure of FIG. 6 along an A1-A2 direction.

As shown in FIG. 1, in some embodiments, the front side 101 of the case body 100 includes a front frame 1 and transparent glass 2 arranged on the front frame 1, and exemplarily, the transparent glass 2 may be toughened glass. Optionally, as shown in FIG. 1 and FIG. 7, the transparent glass 2 is configured to exhibit or display a display module 71 inside the case body 100, and the display module 71 generally directly faces the transparent glass 2; and the front frame 1 generally is made of a metal material, the transparent glass 2 may be fixed to the front frame 1 by screws, a gap between the transparent glass 2 and the front frame is sealed by an adhesive, and exemplarily, the adhesive is an AB adhesive.

Figure 2:
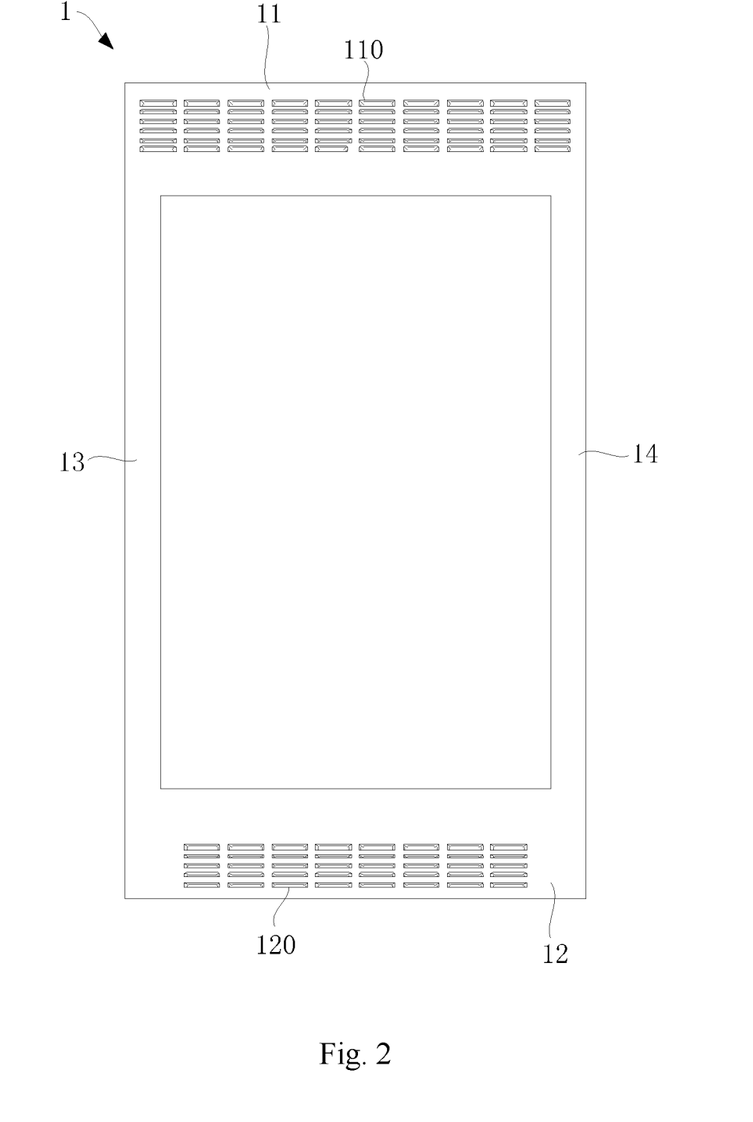
FIG. 2 is a schematic diagram of a structure of a front frame of a case provided by an embodiment of the present disclosure.

Exemplarily, as shown in FIG. 1 and FIG. 2, the vents are disposed on the front frame 1, and the water retaining mechanism is connected with the front frame 1 in a matching manner.

As shown in FIG. 2, in some embodiments, the front frame 1 is of a rectangle shape, and includes upper, lower, left and right borders, i.e., an upper border 11, a lower border 12, a left border 13 and a right border 14 as shown in FIG. 2.

As shown in FIG. 1 and FIG. 2, the vents include the first group of vents 110 and the second group of vents 120; the first group of vents 110 are disposed on the upper border 11, and the second group of vents 120 are disposed on the lower border 12; and the arrangement of both the upper and lower groups of vents is beneficial for forming air flow circulation inside and outside the case body so as to reinforce heat dissipation.

As shown in FIG. 3 to FIG. 5, the water retaining mechanism includes the first baffle 3; the first baffle 3 is arranged at the first group of vents 110 on the upper border 11 and connected with the upper border 11 to form a first water storage portion 30 surrounding the first group of vents 110; and the first baffle 3 may block rainwater through the first group of vents 110 and reserve the water in the first water storage portion 30 so as to avoid a case that the rainwater enters an electronic device accommodation space inside the case body.

As shown in FIG. 3 to FIG. 5, the water retaining mechanism may further include the second baffle 4, the second baffle 4 is arranged on the bottom side 103 and arranged opposite to the second group of vents 120 on the lower border 12, and the second baffle 4 may block rainwater from the second group of vents 120 so as to avoid the rainwater splashing into the electronic device accommodation space inside the case body. As shown in FIG. 3 to FIG. 5 and FIG. 7, in some embodiments, the case further includes a left flow guide plate 51 and a right flow guide plate 52, wherein the edges of the left flow guide plate 51 are respectively connected with the left border of the front frame, the left side 104, the top side 102 and the bottom side 103 so as to form a left flow guide interlayer 510; and the edges of the right flow guide plate are respectively connected with the right border 14 of the front frame, the right side 105, the top side 102 and the bottom side 103 so as to form a right flow guide interlayer 520. FIG. 4 and FIG. 5 show a case that the edges of the right flow guide plate 52 are respectively connected with the right border 14, the right side 105, the top side 102 and the bottom side 103 so as to form the right flow guide interlayer 520.

Optionally, as shown in FIG. 3, an extension direction of the first baffle 3 is the same as an extension direction of the upper border of the front frame, and the edges of both ends of the first baffle 3 in the extension direction of the first baffle 3 are respectively connected with the left flow guide plate 51 and the right flow guide plate 52, so that both ends of the first water storage portion respectively communicate with the left side flow guide interlayer and the right side flow guide interlayer.

Exemplarily, as shown in FIG. 3, water outlets 1030 are respectively formed at one end of the bottom side 103 close to the left side 104, and at one end of the bottom side 103 close to the right side 105; the water outlet 1030 at one end close to the left side 104 is positioned at the left side flow guide interlayer and configured to discharge water in the left side flow guide interlayer; and the water outlet 1030 at one end close to the right side 105 is positioned at the right side flow guide interlayer and configured to discharge water in the right side flow guide interlayer. Optionally, the rainwater reserved in the first water storage portion above may be guided to the bottom side 103 through the left side flow guide interlayer and the right side flow guide interlayer and then discharged through the water outlets 1030 so as to avoid rainwater accumulation.

From the above, the case disclosed by embodiments of the present disclosure cannot only prevent the rainwater from entering the module accommodation space by the first baffle 3 and the second baffle 4, but also guide the rainwater blocked by the first baffle 3 at the upper part to the bottom of the case and discharge the rainwater out of the case body, so that waterproofness of the overall case can be effectively improved.

Figure 6:
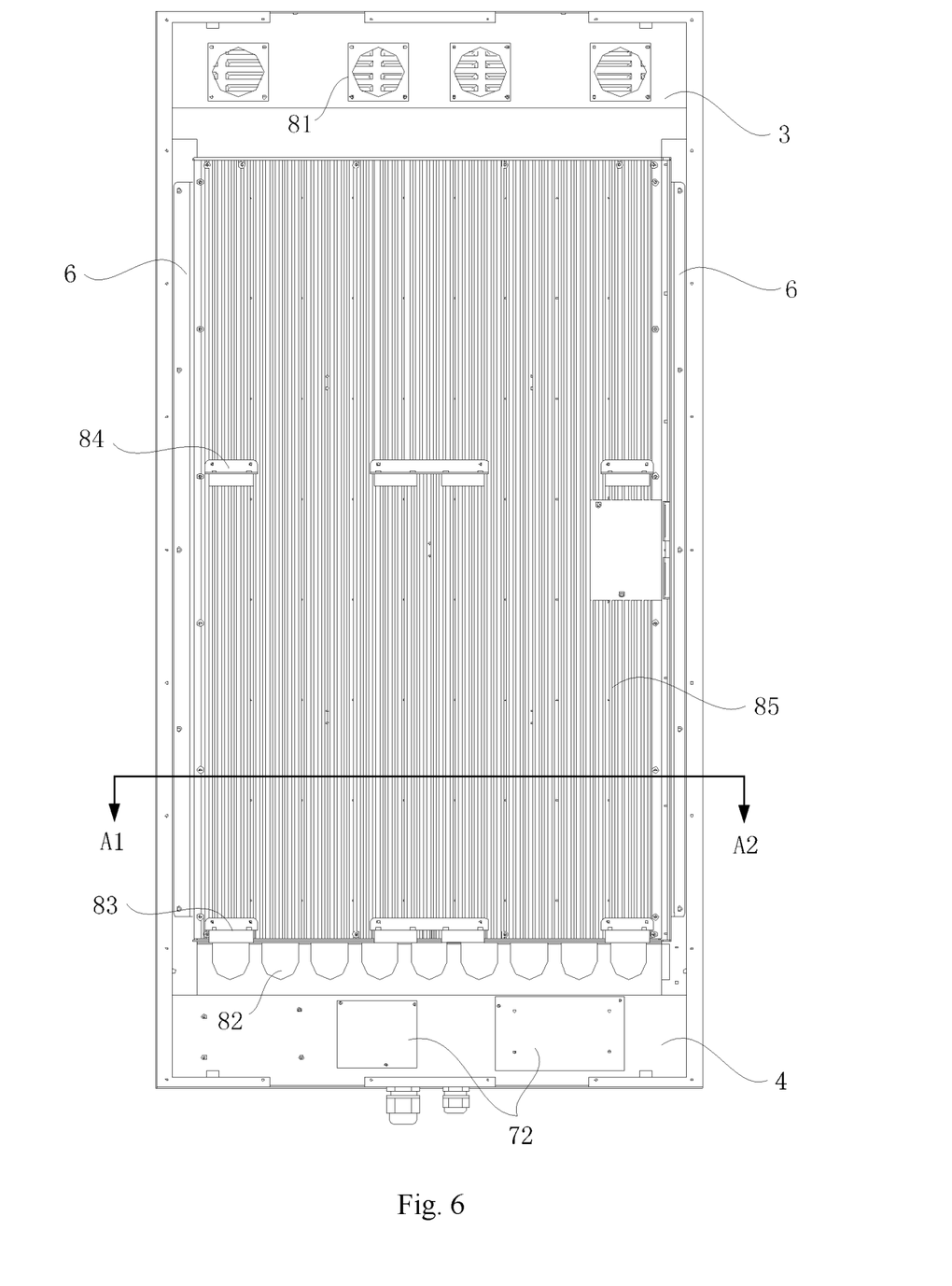
FIG. 6 is a schematic diagram of a partial structure of the inside of a case of an electronic device provided by an embodiment of the present disclosure.

As shown in FIG. 6 and FIG. 7, in some embodiments, in some embodiments, the case further includes two groups of connectors 6 respectively in detachable connection with the left flow guide plate 51 and the right flow guide plate 52, and the two groups of connectors 6 are configured to be in detachable connection with two side end faces of the display module 71 accommodated in the case body so as to respectively fix two side end faces of the display module 71 to the left flow guide plate 51 and the right flow guide plate 52.

Exemplarily, as shown in FIG. 7, the second baffle 4 is positioned right below the display module 71.

In some embodiments, the case may further include a fan assembly, and the fan assembly is positioned in the case body and may form air flow in the case body, so that air inside and outside the case may be circulated through the first group of vents and the second group of vents, and dissipation of heat inside the case body is accelerated.

In some embodiments, as shown in FIG. 3 to FIG. 5, the first baffle 3 may include a first portion 31 and a second portion 32; a main side of the first portion 31 is arranged opposite to the upper border 11 of the front frame and extends from the left side 104 to the right side 105, and the upper edge of the first portion 31 is close to the top side 102 and is connected with the top side 102, while the lower edge is connected with the upper edge of the second portion 32; the second portion 32 is inclined towards the upper border 11 relative to the first portion 31, and the lower edge of the second portion 32 is in sealed connection with the upper border 11; and further, a water storage portion, i.e., the first water storage portion 30, is formed by the first portion 31 and the second portion 32 of the first baffle 3, the upper border 11 and the top side 102 in an enclosed manner together. The first portion 31 directly faces the upper border 11 and may shield the first group of vents 110 so as to avoid rainwater entering the inside cavity through the first group of vents 110, and thus, the blocked rainwater may slide to the bottom of the first water storage portion 30 along the second portion 32 and further flows to the bottom of the case from the left side flow guide interlayer and the right side flow guide interlayer.

Further, as shown in FIG. 4 and FIG. 5, the first portion 31 is provided with openings 310 for allowing air circulation. The air flow in the module accommodation space may sequentially pass through the openings 310 and the first group of vents 110 so as to implement air circulation with the external space.

In some embodiments, as shown in FIG. 3 to FIG. 6, the first portion 31 may be provided with one group of openings 310, and the one group of openings 310 are disposed opposite to the first group of vents 110. The case includes one group of first fans 81 corresponding to the one group of openings 310 inside, and each of the first fans 81 is arranged at the corresponding opening 310, positioned on one side of the opening 310 away from the upper border 11 of the front frame, and configured to blow air to the upper border 11 through the opening 310.

As shown in FIG. 3, FIG. 6 and FIG. 7, in some embodiments, the case further includes one group of second fans 82 inside, and the one group of second fans 82 are fixed to the lower border 12 of the front frame, positioned above the second group of vents 120 and configured to blow air towards the direction of the top side 102 along the front side of the case body.

Figure 8:
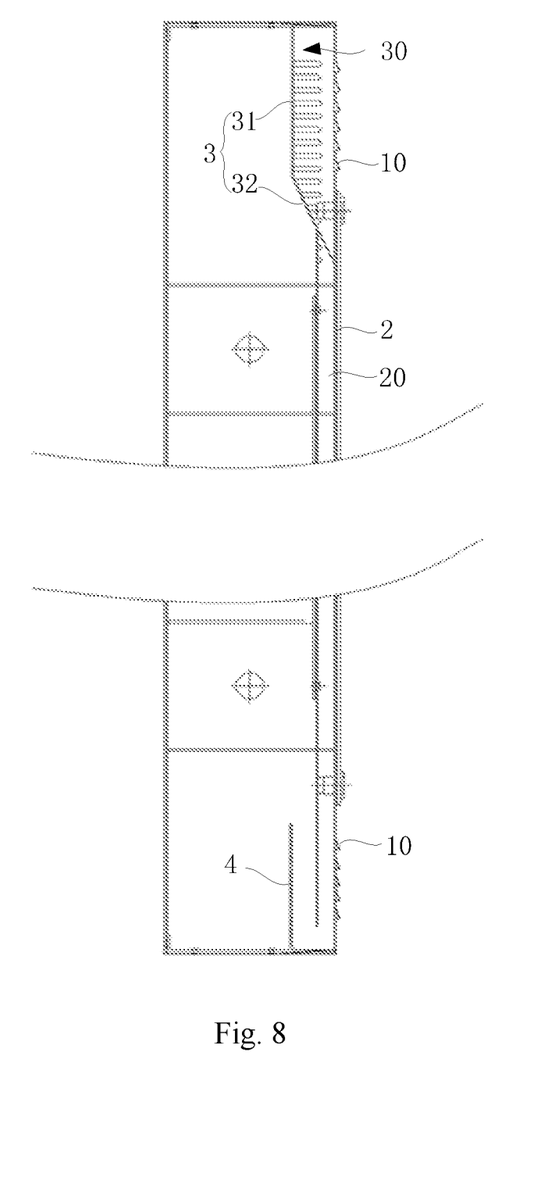
FIG. 8 is a schematic diagram of a partial section structure of an electronic device provided by an embodiment of the present disclosure in a side-view case.

As shown in FIG. 7, the display module 71 is mounted in the case body by the connectors 6, and a gap 20 is formed between a display side of the display module 71 and the transparent glass 2; and optionally, the one group of second fans 82 may blow air into the gap 20 to take away heat between the display module 71 and the transparent glass 2, so that an excessively high temperature between the display module 71 and the transparent glass 2, which is caused by inward irradiation of outdoor sunlight through the transparent glass 2, can be effectively prevented. In addition, as shown in FIG. 6 and FIG. 8, the second portion 32 of the first baffle 3 is inclined towards the upper border 11 of the front frame, and the air flow may ascend along the second portion 32 to reach the first portion 31 after reaching the first baffle 3 through the gap 20, enters the first water storage portion 30 through the openings on the first portion 31 and finally, is discharged out of the case body.

Exemplarily, as shown in FIG. 6 and FIG. 7, the case further includes a heat dissipation plate 85, one group of third fans 83 and one group of fourth fans 84 inside.

Optionally, as shown in FIG. 7, the heat dissipation plate 85 is arranged opposite to the transparent glass 2, the edges of both sides of the heat dissipation plate 85 are respectively connected with the two groups of connectors 6, and a space for accommodating the display module 71 is formed between the heat dissipation plate 85 and the transparent glass 2.

As shown in FIG. 6 and FIG. 7, the third fans 83 and the fourth fans 84 are arranged on the surface of one side of the heat dissipation plate 85 facing away from the transparent glass 2, and configured to blow air towards the direction of the top side 102; and the one group of third fans 83 are arranged close to the lower end of the heat dissipation plate 85, and the one group of fourth fans 84 are positioned above the one group of third fans 83, i.e., one group of fourth fans 84 and one group of third fans 83 are arranged up and down and disposed side by side.

As shown in FIG. 6 and FIG. 7, the heat dissipation plate 85 can accelerate heat dissipation efficiency of the rear side (one side facing the rear side of the case body) of the display module 71, and the third fans 83 and the fourth fans 84 are positioned between the heat dissipation plate 85 and the rear side of the case body and may take away heat between the display module 71 and the rear side of the case so as to accelerate heat dissipation on the rear side of the display module 71. In addition, the third fans 83 are arranged close to the lower end of the heat dissipation plate 85; under the drive of the third fans 83, cold air through the second group of vents may bypass the second baffle 4 to reach the rear side of the display module 71; and under the further drive of the fourth fans 84, the air flow on the rear side of the display module 71 may further ascend to the position of the first baffle 3 so as to take away heat on the rear side of the display module 71, and the air flow reaching the first baffle may be discharged out of the case body through one group of first fans 81.

Exemplarily, as shown in FIG. 6 and FIG. 7, the outside air enters the case body through the second group of vents 120; under the drive of the second fans 82, the third fans 83 and the fourth fans 84, the air flow flows upwards and simultaneously, takes away heat around the display module 71; and further, the air flow may enter the first water storage portion under the drive of the first fans 81 after reaching the upper portion, and is discharged out of the case body through the first group of vents. Such circulation not only can effectively reduce a temperature of a module product, but also can achieve the waterproof effect.

In some embodiments, as shown in FIG. 8, the case body may further be provided with rain shelters 10 corresponding to the positions of the vents (for example, the first vents 110 and the second vents 120 in FIG. 1). Optionally, the rain shelters 10 are positioned above the vents and protrude towards a direction away from an outer side of the case body 100, so that the rainwater entering the case through the vents can be effectively reduced, thereby improving overall waterproofness of the case body 100.

Exemplarily, as shown in FIG. 8, the rain shelters 10 may correspond to the vents one to one, i.e., one rain shelter 10 is arranged above each vent.

Certainly, the rain shelters may also correspond to one group of vents, i.e., one common rain shelter is designed above one group of vents.

As shown in FIG. 3, exemplarily, the front frame of the front side, the top side 102, the bottom side 103, the left side 104 and the right side 105 of the case body may be of an integrated structure, and the integrated structure is a front cover; and the left flow guide plate 51 and the right flow guide plate 52 are separately connected to an inner side of the front cover.

Exemplarily, the edges of both sides of the rear side of the case body may be respectively connected to the left side flow guide plate and the right side flow guide plate by screws so as to implement fixed connection with the front cover. Exemplarily, waterproof foam may also be placed at the junction of the front cover and the rear side so as to prevent the rainwater from entering the case body through an assembly gap.

Optionally, in some embodiments, in the case disclosed by the application, the vents and the water retaining mechanism may also be disposed on the rear side, the left side or the right side, the water retaining structure is not limited to a flat plate and may also be an arc plate or a curved plate, the fan assembly is also not limited to the setting of the first fans, the second fans, the third fans and the like, and specifically, many improvements or modifications can be made according to the invention purpose of the embodiments of the application.

In addition, an embodiment of the present disclosure further provides an electronic device. As shown in FIG. 7, the electronic device includes the case according to any one of the above, and a display module 71 which is positioned in the case body and is in detachable connection with the case body.

Exemplarily, as shown in FIG. 7 and FIG. 8, the case body includes transparent glass 2, and a display side of the display module 71 is opposite to the transparent glass 2.

Exemplarily, as shown in FIG. 6 and FIG. 8, the case includes a first baffle 3 and a second baffle 4, and the first baffle 3 is positioned above the display module; and the second baffle 4 is positioned right below the display module.

Exemplarily, as shown in FIG. 6, the electronic device disclosed by the embodiment of the present disclosure further includes a circuit board 72 which is positioned in the case body and configured to be electrically connected with the display module 71, and the circuit board 72 may include a mainboard and a control circuit board; and the circuit board 72 is arranged on the second baffle 4 and positioned on one side of the second baffle 4 away from the lower border of the front frame. The second baffle 4 may block the rainwater from the second group of vents so as to avoid rainwater splashing to the circuit board 72.

Exemplarily, the electronic device provided by the embodiment of the present disclosure simultaneously gives both consideration to waterproofness and heat dissipation, and may be used as an outdoor advertising machine.

It is evident that one person skilled in the art can make various changes or modifications to the embodiments of the present disclosure without departure from the spirit and scope of the embodiments of the present disclosure. Thus, if these changes and modifications to the embodiments of the present disclosure are within the scope of the claims of the present disclosure and equivalent technologies thereof, the present disclosure also intends to include all such changes and modifications within its scope.

The invention claimed is:

1. A case, comprising: a case body comprising a plurality of case sides, and a cavity enclosed by the case sides, the cavity is configured to accommodate an electronic device; a plurality of vents disposed on at least part of the case sides and configured to ventilate between the case cavity and an external space; and a water retaining mechanism disposed on an inner wall of the cavity of the case body and positioned at the vents; wherein the case body comprises a front side, a rear side, an top side, a bottom side, a left side and a right side: the front side comprises a front frame and transparent glass arranged on the front frame; and the vents are disposed on the front frame of the front side, and the water retaining mechanism is connected with the front frame; and wherein the vents comprises a first group of vents and a second group of vents; the front frame comprises an upper border and a lower border; the first group of vents are disposed on the upper border, and the second group of vents are disposed on the lower border; and the water retaining mechanism comprises: a first baffle arranged at the first group of vents on the upper border and connected with the upper border to form a first water storage portion surrounding the first group of vents; and a second baffle fixed to the bottom side and arranged opposite to the second group of vents on the lower border.

2. The case according to claim 1, wherein the front frame further includes a left border and a right border, the case further comprising a left flow guide plate and a right flow guide plate, wherein edges of the left flow guide plate are respectively connected with the left border, the left side, the top side and the bottom side so as to form a left flow guide interlayer; edges of the right side flow guide plate are respectively connected with the right border, the right side, the top side and the bottom side so as to form a right flow guide interlayer; and an extension direction of the first baffle is same as an extension direction of the upper border, and edges of both ends of the first baffle in the extension direction of the first baffle are respectively connected with the left flow guide plate and the right flow guide plate, so that both ends of the first water storage portion respectively communicate with the left flow guide interlayer and the right flow guide interlayer.

3. The case according to claim 2, wherein water outlets are respectively formed at one end of the bottom side close to the left side, and at one end of the bottom side close to the right side; the water outlet at one end close to the left side is positioned at the left side flow guide interlayer and configured to discharge water in the left side flow guide interlayer; and the water outlet at one end close to the right side is positioned at the right side flow guide interlayer and configured to discharge water in the right side flow guide interlayer.

4. The case according to claim 1, wherein the first baffle includes a first portion and a second portion; a main side of the first portion is arranged opposite to the upper border of the front frame and extends from the left side to the right side; the second portion extends from the left side to the right side; a upper edge of the first portion is close to the top side and is connected with the top side, and a lower edge of the first portion is connected with a upper edge of the second portion; the second portion is inclined towards the upper border relative to the first portion, and a lower edge of the second portion is in sealed connection with the upper border; and the first portion comprises an opening configured to circulate air.

5. The case according to claim 4, wherein the first portion comprises one group of openings, and the one group of openings are disposed opposite to the first group of vents, the case comprising one group of first fans corresponding to the one group of openings, each of the first fans is arranged at a corresponding opening on one side of the corresponding opening away from the upper border of the front frame, and configured to blow air to the upper border through the corresponding opening.

6. The case according to claim 5, further comprising two groups of connectors respectively in detachable connection with the left flow guide plate and the right flow guide plate, the two groups of connectors are configured to be in detachable connection with two side end faces of a display module accommodated in the case body so as to respectively fix the two side end faces to the left flow guide plate and the right flow guide plate.

7. The case according to claim 6, further comprising one group of second fans, the second fans are fixed to the lower border of the front frame, and positioned above the second group of vents and configured to blow air towards a direction of the top side along the front side.

8. The case according to claim 7, further comprising a heat dissipation plate, one group of third fans and one group of fourth fans, the heat dissipation plate is arranged opposite to the transparent glass, edges of both sides of the heat dissipation plate are respectively connected with the two groups of connectors, and a space for accommodating the display module is formed between the heat dissipation plate and the transparent glass;

the third fans and the fourth fans being are arranged on a surface of the heat dissipation plate away from the transparent glass, and configured to blow air towards a direction of the top side; and the third fans are arranged close to a lower end of the heat dissipation plate, and the fourth fans are above the third fans.

9. The case according to claim 1, further comprising rain shelters, positions of the rain shelters corresponds to positions of the vents, and the rain shelters protrude towards a direction away from an outer side of the case body.

10. An electronic device, comprising a display module and the case according to claim 1, the display module is in the case and in detachable connection with the case.

11. The electronic device according to claim 10, wherein the case body comprises a front side, a rear side, an top side, a bottom side, a left side and a right side;
the front side comprises a front frame and transparent glass arranged on the front frame; and
the vents are disposed on the front frame of the front side, and the water retaining mechanism is connected with the front frame.

12. The electronic device according to claim 11, wherein the vents comprises a first group of vents and a second group of vents;
the front frame comprises an upper border and a lower border; the first group of vents are disposed on the upper border, and the second group of vents are disposed on the lower border; and the water retaining mechanism comprises:
a first baffle arranged at the first group of vents on the upper border and connected with the upper border to form a first water storage portion surrounding the first group of vents; and
a second baffle fixed to the bottom side and arranged opposite to the second group of vents on the lower border.

13. The electronic device according to claim 12, wherein the front frame further includes
a left border and a right border,
the case further comprising a left flow guide plate and a right flow guide plate, wherein edges of the left flow guide plate are respectively connected with the left border, the left side, the top side and the bottom side so as to form a left flow guide interlayer; edges of the right side flow guide plate are respectively connected with the right border, the right side, the top side and the bottom side so as to form a right flow guide interlayer; and
an extension direction of the first baffle is same as an extension direction of the upper border, and edges of both ends of the first baffle in the extension direction of the first baffle are respectively connected with the left flow guide plate and the right flow guide plate, so that both ends of the first water storage portion respectively communicate with the left flow guide interlayer and the right flow guide interlayer.

14. The case according to claim 13, wherein water outlets are respectively formed at one end of the bottom side close to the left side, and at one end of the bottom side close to the right side; the water outlet at one end close to the left side is positioned at the left side flow guide interlayer and configured to discharge water in the left side flow guide interlayer; and the water outlet at one end close to the right side is positioned at the right side flow guide interlayer and configured to discharge water in the right side flow guide interlayer.

15. The electronic device according to claim 12, wherein the first baffle includes a first portion and a second portion;
a main side of the first portion is arranged opposite to the upper border of the front frame and extends from the left side to the right side;
the second portion extends from the left side to the right side;
a upper edge of the first portion is close to the top side and is connected with the top side, and a lower edge of the first portion is connected with a upper edge of the second portion; the second portion is inclined towards the upper border relative to the first portion, and a lower edge of the second portion is in sealed connection with the upper border; and
the first portion comprises an opening configured to circulate air.

16. The electronic device according to claim 15, wherein the first portion comprises one group of openings, and the one group of openings are disposed opposite to the first group of vents,
the case comprising one group of first fans corresponding to the one group of openings, each of the first fans is arranged at a corresponding opening on one side of the corresponding opening away from the upper border of the front frame, and configured to blow air to the upper border through the corresponding opening.

17. The electronic device according to claim 16, wherein the case further comprises two groups of connectors respectively in detachable connection with the left flow guide plate and the right flow guide plate, the two groups of connectors are configured to be in detachable connection with two side end faces of a display module accommodated in the case body so as to respectively fix the two side end faces to the left flow guide plate and the right flow guide plate.

18. The electronic device according to claim 17, wherein the case further comprises one group of second fans, the second fans are fixed to the lower border of the front frame, and positioned above the second group of vents and configured to blow air towards a direction of the top side along the front side.

* * * * *